United States Patent
Phan et al.

(10) Patent No.: US 6,486,072 B1
(45) Date of Patent: Nov. 26, 2002

(54) SYSTEM AND METHOD TO FACILITATE REMOVAL OF DEFECTS FROM A SUBSTRATE

(75) Inventors: Khoi A. Phan, San Jose, CA (US); Bharath Rangarajan, Santa Clara, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 29 days.

(21) Appl. No.: 09/709,974

(22) Filed: Nov. 10, 2000

Related U.S. Application Data

(60) Provisional application No. 60/242,502, filed on Oct. 23, 2000.

(51) Int. Cl.⁷ .............................................. H01L 21/302
(52) U.S. Cl. ...................... 438/706; 438/707; 438/708; 156/345
(58) Field of Search .................... 156/345; 361/226; 250/492.1, 492.2, 492.3; 315/111.21; 219/121.4; 438/700, 706, 707, 708, 709, 710

(56) References Cited

U.S. PATENT DOCUMENTS

| | | | |
|---|---|---|---|
| 4,088,926 A | * 5/1978 | Fletcher et al. | 315/111.2 |
| 4,450,031 A | 5/1984 | Ono et al. | |
| 4,461,954 A | * 7/1984 | Inoue | 250/492.2 |
| RE33,193 E | 4/1990 | Yamaguchi et al. | |
| 4,924,104 A | * 5/1990 | Stengle et al. | 250/492.3 |
| 5,302,237 A | * 4/1994 | Larson et al. | 156/345 |
| 5,336,355 A | * 8/1994 | Zarowin et al. | 156/345 |
| 5,479,252 A | 12/1995 | Worster et al. | |
| 5,482,802 A | * 1/1996 | Celler et al. | 430/5 |
| 5,583,344 A | 12/1996 | Mizumura et al. | |
| 5,849,093 A | 12/1998 | Andra | |
| 5,945,354 A | 8/1999 | Mautz | |
| 6,033,484 A | 3/2000 | Mahoney | |
| RE36,760 E | * 7/2000 | Bloomquist et al. | 250/492.21 |

* cited by examiner

*Primary Examiner*—Felisa Hiteshew
*Assistant Examiner*—Duy-Vu Deo
(74) *Attorney, Agent, or Firm*—Amin & Turocy, LLP

(57) ABSTRACT

A system and method are disclosed for facilitating removal of a defect from a substrate. A charge is applied at the surface of substrate, such as in the form of an ionized gas, to weaken attractive forces between the defect and the substrate. As a result of weakening the attractive forces, a suitable defect removal system may be employed to remove the defect.

29 Claims, 7 Drawing Sheets

SYSTEM AND METHOD TO FACILITATE REMOVAL OF DEFECTS FROM A SUBSTRATE

CROSS REFERENCE TO RELATED APPLICATIONS

This application claims the benefit of U.S. Provisional Patent Application Serial No. 60/242,502, filed Oct. 23, 2000, entitled SYSTEM AND METHOD TO FACILITATE REMOVAL OF DEFECTS FROM A SUBSTRATE.

TECHNICAL FIELD

The present invention generally relates to semiconductor processing and, more particularly, to a system and method for facilitating removal of defects from a substrate.

BACKGROUND

The tendency of semiconductor devices such as integrated circuits (IC) and large scale integrated circuits (LSIC) toward minuteness has rapidly progressed, and higher accuracy has been required of apparatuses for manufacturing such semiconductor devices. In particular, such requirements are demanded from exposure devices in which a circuit pattern of a mask or a reticle is superposedly transferred onto a circuit pattern formed on a semiconductor substrate. It is desired that the circuit pattern of the mask and the circuit pattern of the substrate be superposed one upon the other with accuracies of, for example, less than 0.1 $\mu$m.

In order to remain competitive, semiconductor manufacturers continually strive to reduce costs associated with manufacturing semiconductor chips while at the same time improving yield in the manufacturing process. However, substrate defects typically result in a decreased yield and, in turn, provide associated increases in the manufacturing cost. Some defects exist, for example, on blank substrates as purchased. Other defects might be caused during manufacturing, such as by a process tool utilized during fabrication of the substrate. One particular type of defect is in the form of a contaminant particle that may adhere to the substrate during processing. Therefore, particle removal is a major issue in substrate surface preparation.

One factor to consider in the development of any cleaning method is to effectively overcome the forces in play between the substrate and the different foreign materials present on the surface of the substrate. Other relevant factors include mitigating deposition and redeposition of contaminants, mitigating damage to the substrate, and mitigating safety and environmental hazards.

Various methodologies exist for removing defects on substrate surfaces. Such methodologies are generally divided into two categories: wet-cleaning methods and dry-cleaning methods. Examples of wet-cleaning methods include: dissolving the foreign material in a solvent or aqueous solution; immersing the substrate in a solvent or aqueous solution to reduce Van der Waals forces; and providing a fluid flow across the substrate to provide a drag force on the particle, causing it to slide or roll off. Examples of dry-cleaning methods include: etching the substrate surface to dislodge the foreign material; using a vibration action to cause particle removal by liftoff; electrostatic attraction of charge particles to cause liftoff; and spinning the substrate to provide a centrifugal force that causes the particle to slide or roll off.

However, a substrate surface may be further contaminated by the cleaning method and the equipment used. This is possible by exposing the surface to contaminants in the chemicals, equipment, and environment used for cleaning or by making the surface highly susceptible to mechanisms by which redeposition is promoted after cleaning. Such redeposition may occur by failing to eliminate electrostatic and ionic charges on the surface.

As it becomes more and more difficult to adequately clean the substrate, cleaning methodologies are becoming more aggressive. For example, cleaning methods such as etching, chemical attacks, and mechanical force are being employed, which may damage a substrate during cleaning.

Wet-cleaning methods are conventionally employed more frequently than dry-cleaning methods. Also, wet-cleaning methods are easily applicable to the removal of particles and contamination above 1 $\mu$m in size. However, as cleaning specifications become tighter, and the other factors such as deposition/redeposition, safety, and environmental requirements become more important, wet-cleaning becomes less advantageous. Further, water rinsing and the subsequent problems with drying, which are common to the liquid phase cleaning methods, are not encountered when employing dry-cleaning methods. In addition, as device densities continue to increase, it becomes more desirable to remove submicron and contaminants, which is difficult with wet-cleaning methods.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides a system and method to facilitate the removal of substrate defects, such as contaminant particles. One aspect of the present invention utilizes a charge to loosen a defect relative to the substrates so that a defect removal system, such as a pump system, may be employed to remove the defect from the substrate. According to a particular aspect, an ionized gas is applied to the surface of the substrate to weaken the attractive forces between the defect and the substrate. As a result, the present invention is able to help produce a substrate of increased quality (e.g., fewer defects, less damage to the surface, etc.) comparable to situations when the present invention is not employed.

One aspect of the present invention provides a system for facilitating defect removal. The system includes a processing environment in which a substrate may be supported for processing. A source is operable to apply a charge toward a surface of the substrate for loosening at least one defect relative to the substrate. A defect removal system associated with the processing environment, in turn, removes the defect relative to the substrate.

Another aspect of the present invention provides a method of facilitating removal of a defect relative to a substrate. The method includes applying a charge to loosen the defect relative to the substrate and removing the defect relative to the substrate. According to one particular aspect, the charge may be applied via an ionized gas directed to a surface of a substrate as a beam.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

Figure 1:
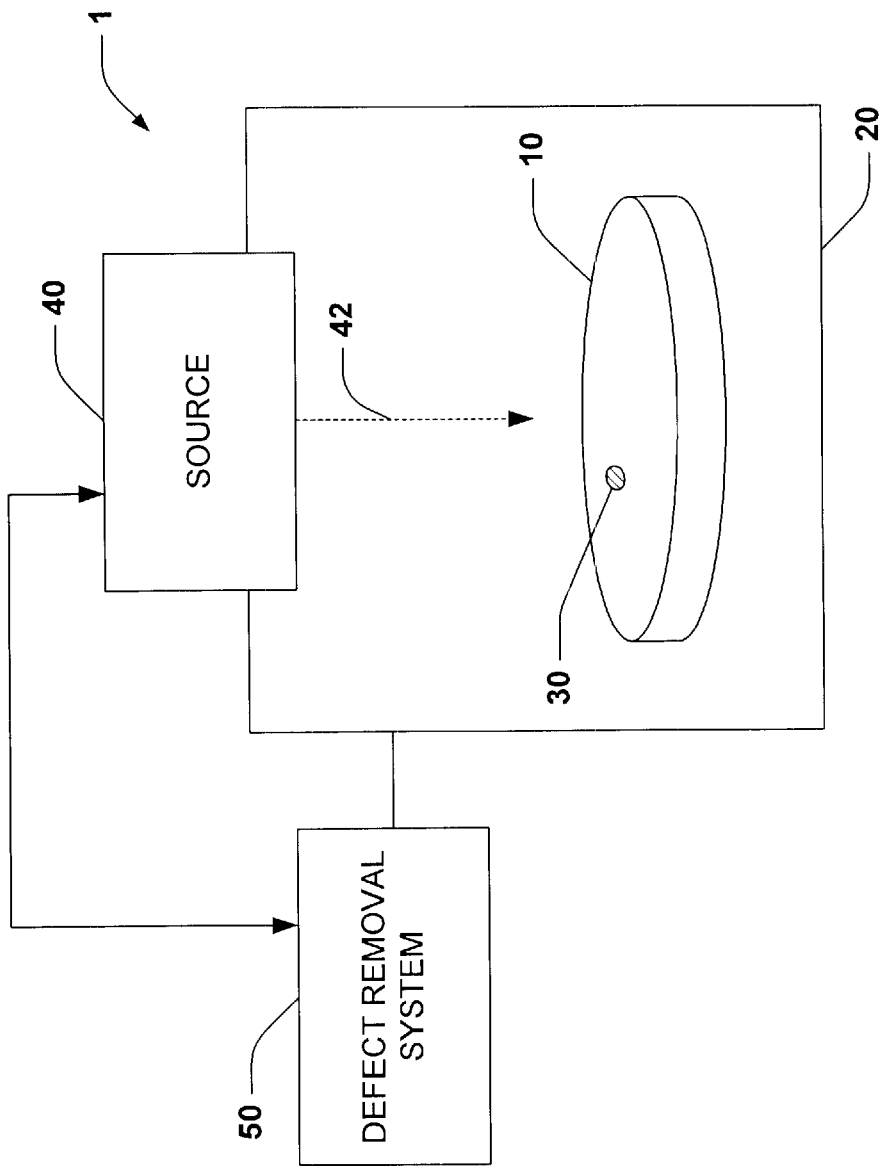
FIG. 1 is a schematic illustration of a system for facilitating defect removal in accordance with the present invention.

The present invention will now be described with reference to the drawings, wherein like reference numerals are used to refer to like elements throughout.

FIG. 1 is an example of semiconductor processing system 1 incorporating a defect removal system to facilitate defect removal in accordance with the present invention. In the system 1, a substrate 10 is located in a processing environment 20 to facilitate removal of one or more defects 30 from the substrate. The processing environment 20 may include an enclosed chamber, such as an ionization/vacuum chamber. The enclosed chamber provides a controlled volume in which substrates may be cleaned so as to reduce the risk of redeposition of contaminants.

To facilitate the removal of substrate defects 30, a source 40 is coupled with the processing environment 20 and is operable to apply a charge to the substrate 10 and/or the processing environment 20. The charge is employed to loosen the defects 30 relative to the substrate 10 by weakening the forces which operate to bind the defects 30 to the substrate 10. The charge may be applied, for example, as a beam 42 of an ionized gas directed toward the surface of the substrate 10. The defects 30, for example, may be contaminant particles created or dislodged from during one or more stages of semiconductor processing, such as by process tools or chemicals being employed. Other defects may exist on blank substrates as purchased.

Also associated with the processing environment 20 is a defect removal system 50. The defect removal system 50 is operable to remove particles from the substrate 10 and the surroundings (e.g., from the processing environment 20), thus reducing the likelihood of particles from contaminating the processing environment 20 and redepositing on the cleaned substrate 10. One example of a defect removal system 50 blows air across the substrate surface. The blown air emanates from a blower and may be ionized. Ionized air helps prevent static discharge, which could damage semiconductor parts, and also mitigates redeposition of particles onto the substrate surface.

A vacuum system may be further employed to capture dust particles blown off the surface of the substrate 10. The vacuum system captures blown particles, thereby mitigating particles from migrating into the processing environment 20 and redepositing on the substrate 10 being cleaned, or other substrates.

While, for purposes of brevity, a single substrate 10 is shown and described with respect to the processing environment 20 of FIG. 1, it is to be understood that there may be a number of substrates within the environment 20. Such substrates, regardless of number, may be cleaned in accordance with an aspect of the present invention.

Figure 2:
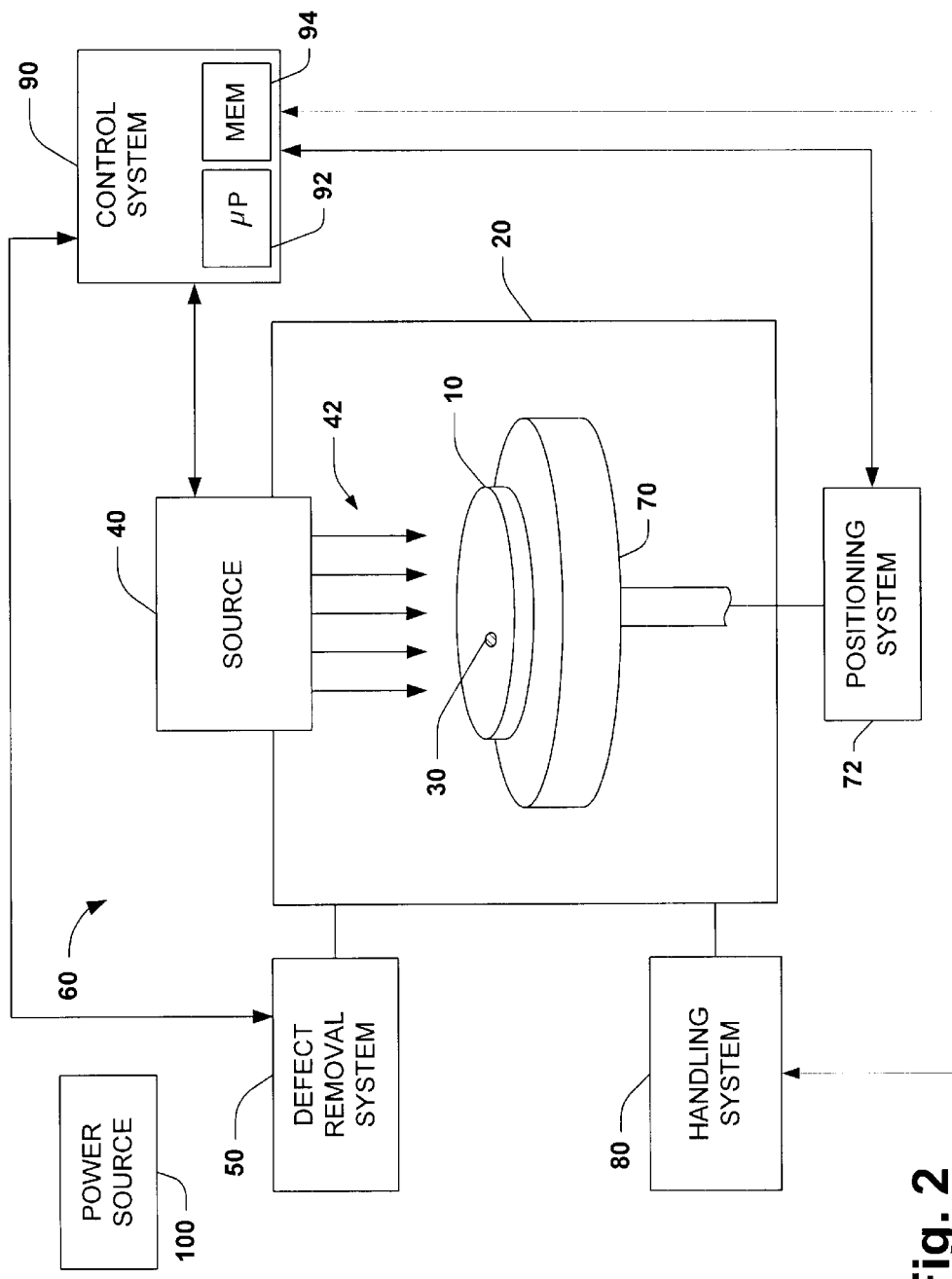
FIG. 2 is another example of a system to facilitate defect removal in accordance with the present invention.

FIG. 2 is an example of a system 60 which may be employed, in accordance with an aspect of the present invention, to remove defects 30 from a substrate 10. In this example, the substrate 10 is located on a support 70. A positioning system 72 is operatively associated with the support for positioning the support and substrate 10 at a desired position within the system 60. The positioning system 72 further may rotate the support 70 about a central axis.

The system 60 also may include a substrate handling system 80. The handling system 80 may cooperate with the positioning system 72 to transfer substrates to and from the support 70. The handling system 80, for example, includes a conveyor belt to move the substrate 10 between previous and subsequent operations and the processing chamber 20. The conveyor belt may be utilized in conjunction with a robotic system to move the substrate 10 between the conveyor belt and the support 70.

The system 60 further includes a source 40 for applying a charge to the substrate 10. For example, the charge may be applied as an ionized gas 42. The ionized gas 42 may comprise an inert gas, such as helium, neon, argon, krypton, xenon and/or radon. Such gases, when appropriately ionized, interfere with attractive forces (e.g., Van der Waals forces) between defects and the surface of the substrate, such as contaminant particles. As a result, the defects 30 become loosened relative to the substrate surface so that their removal is facilitated in accordance with an aspect of the present invention.

A defect removal system 50 also is provided for removing defects 30 loosened in response to application of a desired gas to the surface of the substrate 10. The defect removal system 50 may include a vacuum or pump operable to urge loosened particles from the processing environment 20. The vacuum may be used in conjunction with a blower to help remove defects 30 loosened in accordance with the present invention and mitigate redeposition onto the substrate 10.

A control system 90 is provided to monitor and/or control operation of the various components 40, 50, 72, 80 in the system 60. The control system 90 includes a processor 92 that is programmed and/or configured to control and operate the source 40 and other various components 50, 72, and 80 of the system 60 in order to carry out the various functions described herein. The manner in which the processor 92 can be programmed to carry out the functions relating to the present invention will be readily apparent to those having ordinary skill in the art based on the description provided herein.

A memory 94 which is operatively coupled to the processor 92 is also included in the control system 90 and serves to store program code executed by the processor 92 for carrying out operating functions of the system 60 as described herein. The memory 94 includes, for example, read only memory (ROM) and random access memory (RAM). The RAM is the main memory into which the operating system and application programs are loaded. The memory 94 also serves as a storage medium for storing information such as wafer position, coordinates of defects on the wafer, wafer coordinate tables, orientation feature information, chemical data for detected defects, programs for determining wafer center and defect locations, and other data, as will be described in more detail below, which may be employed in carrying out the present invention. For mass data storage, the memory 94 may also include a hard disk drive.

A power source 100 provides operating power to the system 60. Any suitable power source (e.g., battery, line power) 100 may be employed to implement the present invention.

Figure 3:
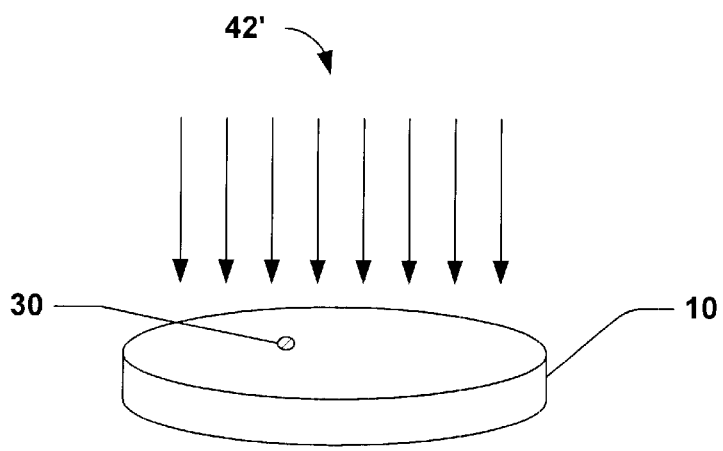
FIG. 3 is a schematic illustration of a showered ion beam being applied to a substrate in accordance with the present invention.

FIG. 3 illustrates an example of applying an ionized gas to the substrate 10 in accordance with an aspect of the present invention. The source applies a charge to the substrate 10 by providing a beam in the form of a broad shower 42' of an ionized gas. The ion shower 42' is provided with charge at a low voltage sufficient to interact with the defect 30 and the substrate 10 (e.g., weakening the attractive forces therebetween) without damaging the substrate surface. The chemical interaction between the ionized gas 42' and the defect 30 weakens the adhesion forces which cause the defect 30 to attach to the substrate 10. For example, such forces may include Van der Waals forces, electrostatic forces, and capillary forces. The ion shower 42' may extend over a selected portion or the entire substrate surface, thus applying a charge to many defects concurrently.

Figure 4:
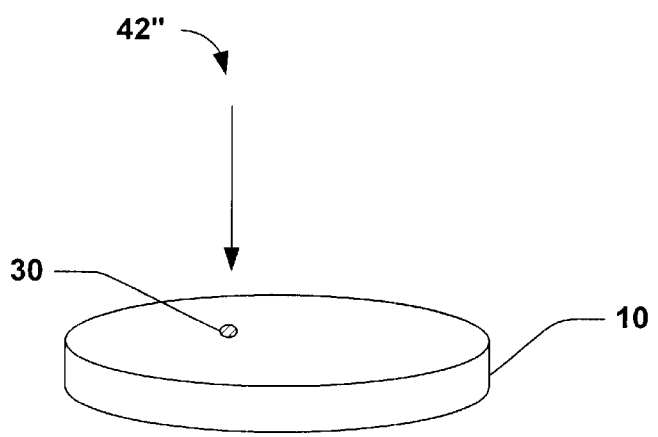
FIG. 4 is a schematic illustration of a focused ion beam being applied to a substrate in accordance with the present invention.

FIG. 4 illustrates another example of applying an ionized gas 42" to the substrate 10 in accordance with an aspect of the present invention. Similar to the ion shower 42' example of FIG. 3, an ionized gas is applied to the substrate surface to weaken adhesion forces between the defect 30 and the substrate 10. However, to effectively target a specific defect or a group of defects, the ionized gas is applied as a focused beam 42". Targeting a specific defect or defects is significant when applying a selected gas to react with the defect, which is explained in further detail below.

Figure 5:
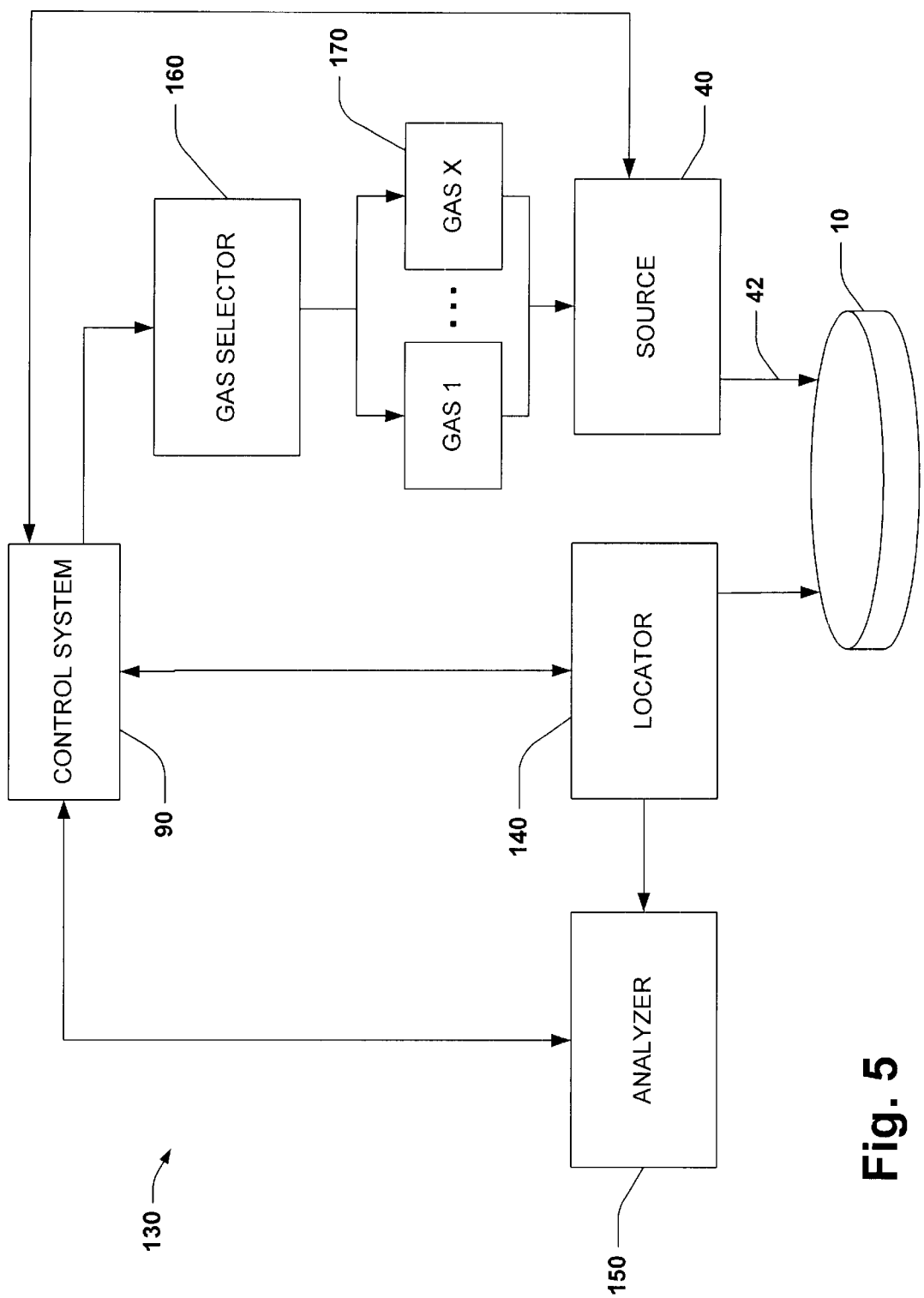
FIG. 5 is another example of a system to facilitate defect removal in accordance with the present invention.

FIG. 5 illustrates another example of a system 130 for facilitating removal of a defect 30 in accordance with an aspect of the present invention. The system 130 includes a locator 140, such as a Scanning Electron Microscope (SEM) or other scanning apparatus, operable to locate a defect on the surface of the substrate 10 and to provide information indicative of the defect's location. In the example of FIG. 5, the locator 140 is coupled to an analyzer 150 and to a control system 90. The locator 140 scans the surface of the substrate 10 and provides a signal to the control system and/or to the analyzer indicative of the sensed surface characteristics of the substrate, including defects thereon.

The analyzer 150 also is coupled to the control system 90. The analyzer 150 is programmed and configured to determine a composition (e.g., chemical properties) of the scanned portions of the substrate, including defects. For example, a laser imaging system using confocal laser scanning microscopy techniques and fluorescence of contaminants provides positive identification of the origin and nature of the defects. Alternatively, however, the locator 140 may communicate the position of the defect directly to the analyzer 150. The location information may be utilized in conjunction with the chemical composition information to determine a composition of defects. The analyzer 150, in turn, may provide a signal to the control system 90 indicative of the composition of defects. The control system 90 may employ the composition information in conjunction with the corresponding location information to target a selected charge at defects to effect their selected removal.

In particular, the control system 90 is operatively coupled to a gas selector 160 which is operable to select a type of gas that is to be ionized and provided to the substrate by a source of ionized gas 40. With cognition of the composition of defects, the control system 90 provides control information to the gas selector 160 to select an appropriate type of gas 170 to facilitate removal of the defect. The source 40 receives one or more of the selected gases 170 and energizes the gas to a desired charge to provide an ionized gas 42' capable of weakening the forces between defects and the substrate, thereby facilitating defect removal.

The control system 90 also may provide a control signal to the source 40 for controlling energization of the selected gas into an ionized gas 42. The control system 90 may control the charge level to which the gas is ionized by the source 40. The control system 90 also may provide a control signal to the source 40 for controlling the location at which the ionized gas is being applied. Such controls may be based on the location information and the composition analysis information provided by locator 140 and the analyzer 150, respectively. To effect more selective removal of defects located by the locator 140 and analyzer 150, the ionized gas 42 may be applied as a focused beam. In this way, a selected gas may be employed at a determined charge according to the sensed location and determined defect characteristics (e.g., composition). An appropriate charge detector (not shown) also may be provided to regulate the charge of the gas being applied so as to mitigate damage to the substrate 10.

While the analyzer is described as an independent functional element, those skilled in the art will understand and appreciate that the analyzer alternatively could be implemented as part of the control system or the locator system.

Figure 6:
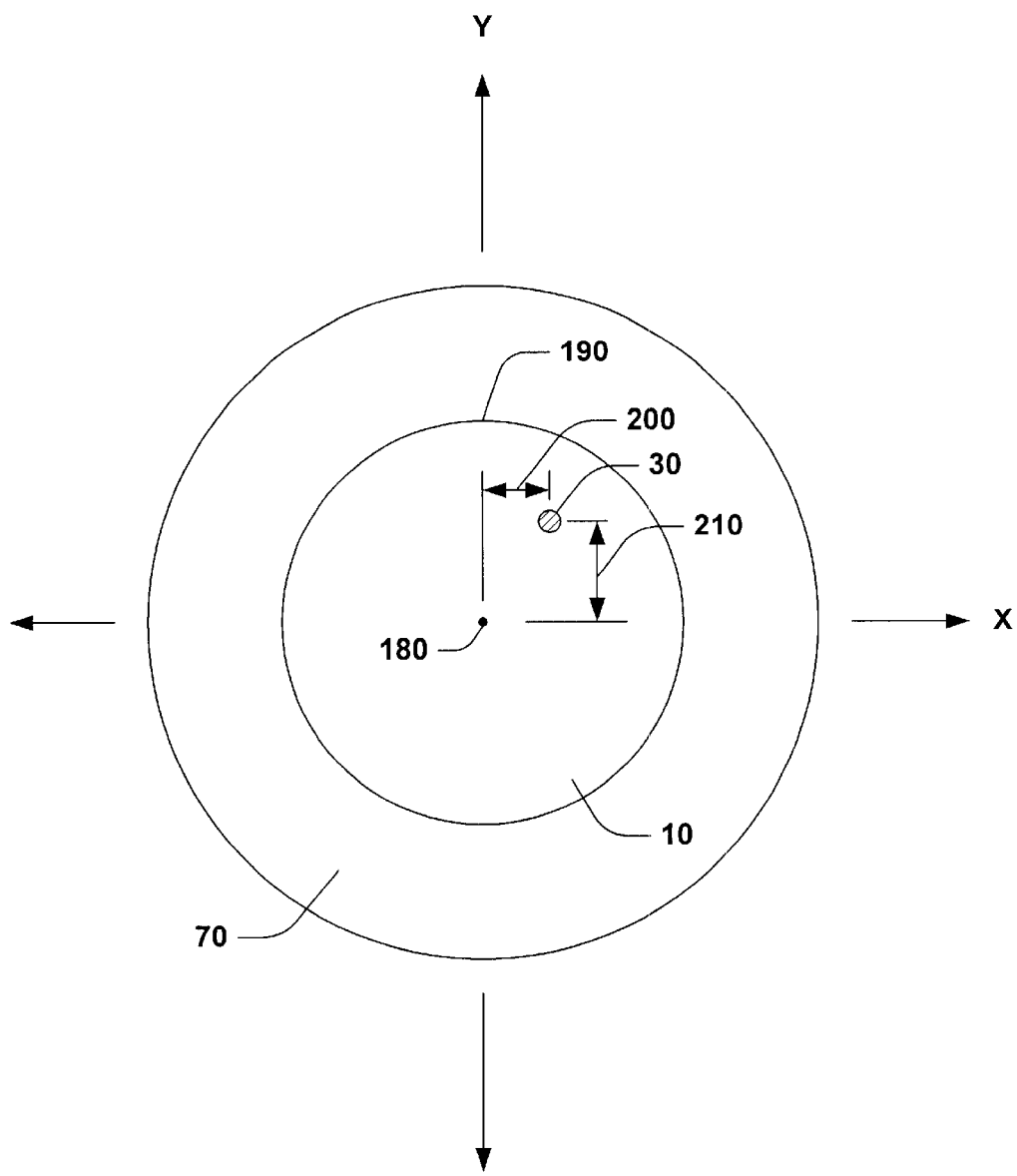
FIG. 6 is a top view of a substrate illustrating an example of locating a defect for use in accordance with the present invention.

FIG. 6 is a top view of a substrate 10 located on a support 70, illustrating an example of locating substrate defects that may be implemented in conjunction with the present invention. The support 70 is provided with one or more reference markings (not shown), which may be utilized to align the substrate in a manner that facilitates mapping of its surface characteristics. The reference markings may be arranged in a grid-like pattern; however, any suitable mark schema may be employed. The grid-like pattern forms a reference coordinate system (e.g., a Cartesian coordinate system) having X and Y coordinate axes. It is to be understood and appreciated that, while the example of FIG. 6 illustrates a Cartesian coordinate system, other types of coordinate systems (e.g., polar) may also be used.

Once the substrate 10 is positioned on the support 70, the relative position of the center 180 of the substrate 10 may be calculated by employing any known locating technique. For example, a microprocessor-based scan data processing system locates points along the circumference of the substrate 10 so as to define an edge 190 of the substrate. Such information is then employed to locate the center 180 of the substrate 10. The X and Y coordinates of the substrate center 180 are communicated to a control system.

The position of the substrate center 180 (or other selected geometric position) provides a reference point of the substrate 10 to which other pertinent features of the substrate, such as defects 30, may be located. By way of example, a locating system, such as that employed to locate the substrate center 180, locates a defect 30 relative to the reference coordinate system. The relative location of the defect 30 in the reference coordinate system is then determined relative to the substrate center 180. For purposes of explanation, a reference line 200 is drawn in the X direction from the substrate center 180 to the defect 30. Another reference line 210 is drawn in the Y direction from the substrate center 180 to the defect 30. The two distances 200 and 210 provide an indication of the location of the defect 30 relative to the substrate center 180. As a result, the location of defects may repeatedly be determined relative the substrate center 180. The location information thus may be employed to provide a focused beam of an appropriately ionized gas to each defect location to facilitate defect removal.

It is to be appreciated that a number of other geometric reference points of the substrate 10 (other than the substrate center 180) exist which could be implemented in accordance with the present invention. The position of any such reference point would be determined in the reference coordinate system of the support 70 in substantially the same manner as described herein. A corresponding positional relationship between the reference point and each defect would then be determined and employed to calculate the relative location of the respective defect on the substrate 10. Those skilled in the art will understand and appreciate other defect locating techniques that might be employed. The use of any and all such defect location techniques is intended to fall within the scope of the present invention as defined by the appended claims.

While, for purposes of brevity, a single defect 30 is shown and described with respect to the substrate 10 of FIG. 3, it is to be understood that there are typically a number of defects on a substrate. Such defects, regardless of number, may be located readily in accordance with the present invention. It is also to be appreciated that the size of the defect 30 relative to the substrate 10 has been exaggerated for ease of illustration. The defect is typically a particle loosely held to the substrate by relatively weak attractive forces.

Figure 7:
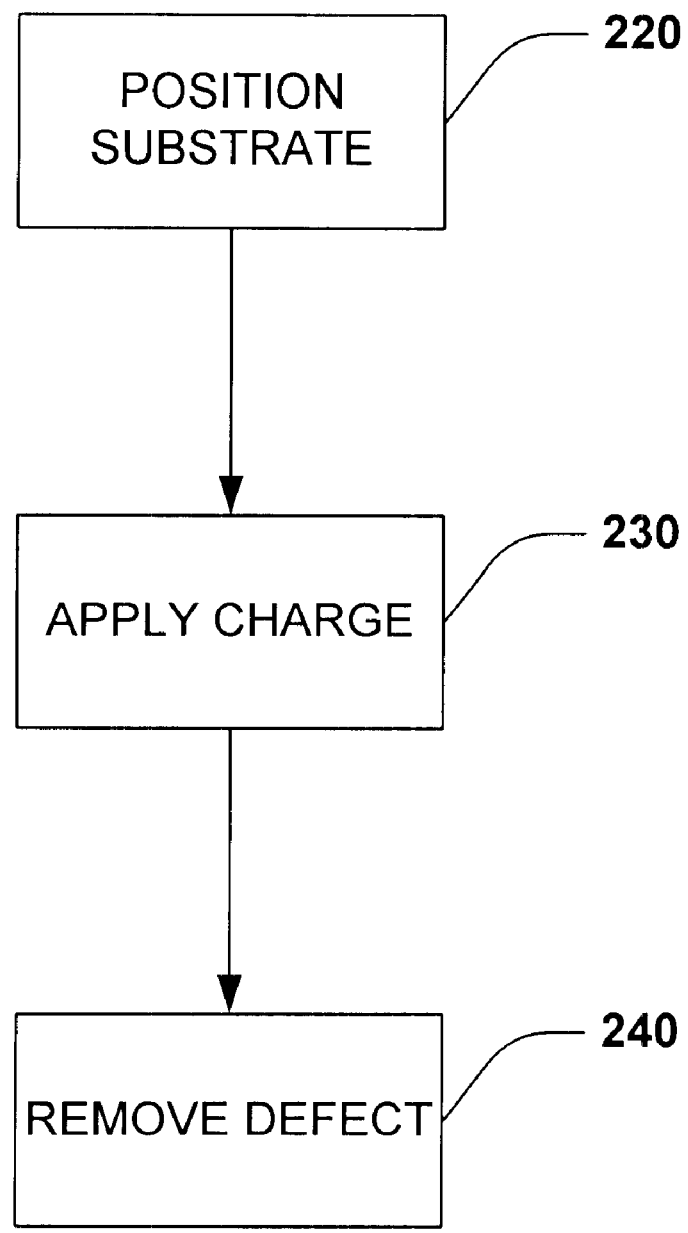
FIG. 7 is a flow diagram illustrating a methodology for facilitating removal of a defect in accordance with the present invention.
Figure 8:
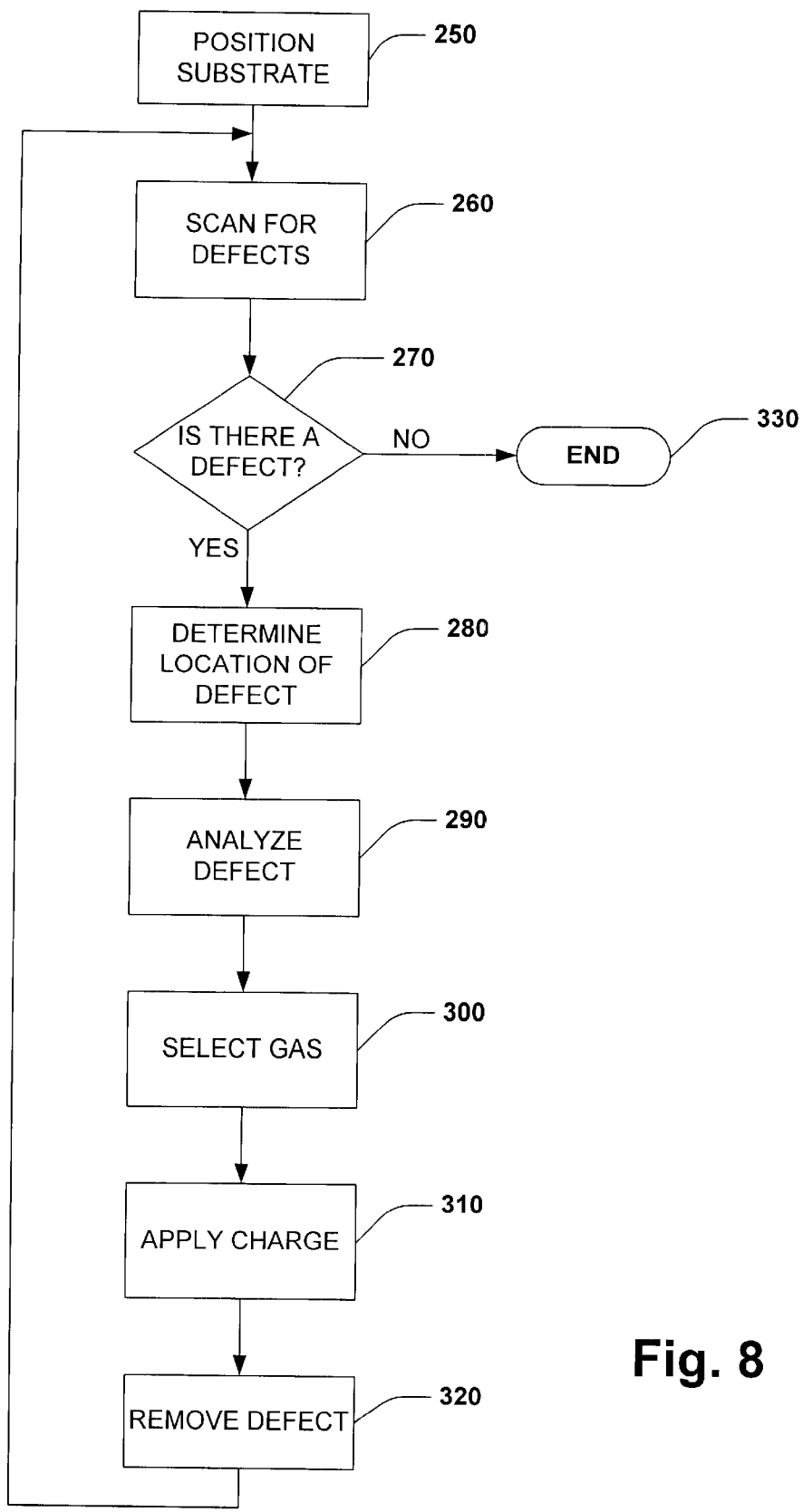
FIG. 8 is a flow diagram illustrating a methodology for facilitating removal of a defect in accordance with the present invention.

In view of the foregoing structural and functional features described above, methodologies in accordance with various aspects of the present invention will be better appreciated with reference to FIGS. 7 and 8. While, for purposes of simplicity of explanation, the methodologies of FIGS. 7 and 8 are shown and described as a series of steps, it is to be understood and appreciated that the present invention is not limited by the order of steps, as some steps may, in accordance with the present invention, occur in different orders and/or concurrently with other steps from that shown and described herein. Moreover, not all illustrated steps may be required to implement a methodology in accordance with an aspect the present invention.

Turning now to FIG. 7, a flow diagram illustrating an exemplary methodology for removing defects on a substrate, in accordance with an aspect of the present invention, is illustrated. The method begins at step 220 in which the substrate is positioned on the support within a processing environment. Next, at step 230, a source associated with the processing environment is employed to apply a charge to effectively loosen the defect relative to the substrate. The charge may be applied as an ionized gas (e.g., a focused or showered beam), although other charge transport mediums may be used. From step 230, the methodology proceeds to step 240 in which the loosened defects are removed from the substrate and the processing environment. Such removing may include, for example, using a vacuum to capture particles blown off the substrate, thus preventing redeposition.

FIG. 8 is a flow diagram illustrating another exemplary methodology for removing defects on a substrate in accordance with the present invention. The method begins at step 250 in which a substrate is positioned on a support within the processing environment. Next, the surface of the substrate is scanned for defects. For example, a locator, such as a scanning electron microscope, is employed to scan the substrate for defects. Next, at step 270, a determination is made as to whether a defect has been located. If the determination at step 270 is positive, indicating that the defect has been detected on the substrate, the method proceeds to step 280. At step 280, the relative location of the defect is determined. For example, the locator finds the X and Y coordinate position of the defect relative to a substrate center (or other reference point or points) and communicates the position to a control system.

From step 280, the process proceeds to step 290 in which the defect properties are analyzed. The analysis, for example, includes determining a composition of the defect located at step 280. The composition may be determined based on the same scan data from which the defect was detected, although a separate non-destructive scanning technique also could be employed.

The methodology then proceeds to step 300. At step 300, a gas may be selected based on the composition of the defect. The gas should be selected so as to be effective to loosen the defect in relation to the substrate. For example, the selected gas may be of a composition so as to, when appropriately ionized, interact with the defect and substrate to weaken the Van der Waals forces between the defect and substrate. Next at step 310, the gas is charged to a desired potential to form an ionized gas. The gas may be provided as a focused or showered beam, such as according to the location and/or composition of the defect.

The methodology proceeds to step 320 in which defects are removed relative to the substrate and/or from the processing environment. From step 320, the process returns to step 250 to continue scanning the substrate for defect and removal of defects, in accordance with an aspect of the present invention. After the entire surface of the substrate has been scanned and the determination at step 270 is negative, the process proceeds to step 330 and the methodology ends.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of facilitating removal of a defect relative to a substrate, comprising:

employing a processing environment;

employing a substrate supported located in the processing environment;

employing an analyzing device for determining a composition of the defect;

employing a source for applying a charge to a surface of the substrate for loosening the defect relative to the substrate; and employing a defect removal system associated with the processing environment for removing the defect relative to the substrate.

2. The method of claim 1, wherein the step of applying further comprises applying an ionized gas to loosen the defect relative to the substrate.

3. The method of claim 2, wherein the ionized gas is applied as a showered ion beam to provide the ionized gas to a substantial part of a surface area of the substrate.

4. The method of claim 2, wherein the ionized gas comprises an inert gas.

5. The method of claim 4, wherein the inert gas comprises at least one of helium, neon, argon, krypton, xenon, and radon.

6. The method of claim 1, further comprising locating the defect relative to the substrate and directing a focused ion beam at the located defect to loosen the defect relative to the substrate.

7. The method of claim 6, further comprising determining an x and y coordinate position of the defect relative to the substrate and directing the focused ion bean based on the x and y coordinate position to loosen the defect relative to the substrate.

8. The method of claim 6, further comprising applying an ionized gas according to the composition of the defect.

9. The method of claim 8, further comprising selecting a type of ionized gas to apply onto the substrate based on the composition of the at least one defect.

10. The method of claim 9, further comprising applying the selected ionized gas as a focused beam to the surface of the substrate according to the location of the defect.

11. The method of claim 1, further comprising applying an ionized gas according to the composition of the defect.

12. The method of claim 8, further comprising selecting a type of ionized gas to apply onto the substrate based on the composition of the at least one defect.

13. The method of claim 1, wherein the at least one defect is loosened by weakening Van der Waals forces between the at least one defect and the substrate.

14. The method of claim 1, wherein the step of removing further comprises pumping the at least one defect from a chamber in which the substrate is located.

15. A system for facilitating defect removal, comprising:

a processing environment;

a substrate supported located in the processing environment;

an analyzing device for determining a composition of at least one defect;

a source operable to apply a charge to a surface of the substrate for loosening the at least one defect relative to the substrate; and a defect removal system associated with the processing environment for removing the at least one defect relative to the substrate.

16. The system of claim 15, wherein the defect removal system comprises a pump for pumping defects from the processing environment.

17. The system of claim 15, further comprising a substrate support operable to support a plurality of substrates.

18. The system of claim 17, further comprising a substrate handling system configured to transfer the substrate to and from the substrate support.

19. The system of claim 15, further comprising a locating device operable to determine a position of the at least one defect relative to the substrate.

20. The system of claim 19, wherein the source provides a gas, which is selected based on the composition of the at least one defect.

21. The system of claim 20, wherein the source of the gas provides an ionized gas toward the substrate as a focused ion beam according to the position of the at least one defect.

22. The system of claim 20, further comprising a control system coupled to the locating device, the analyzing device and the source, the control system is capable of controlling the source to select the gas to direct at the defect based on at least one of the position and composition of the defect.

23. The system of claim 15, wherein the source provides the ionized gas toward the substrate as a showered ion beam.

24. The system of claim 20, wherein the gas is for loosening the at least one defect.

25. The system of 24, further comprising a control system coupled to the locating device, the analyzing device and the source, the control system is capable of controlling the source to select the gas to direct at the defect based on at least one of the position and composition of the defect.

26. A system for facilitating defect removal, comprising:

means for supporting a substrate for processing;

means for analyzing a composition of at least one defect;

means for applying a charge at the surface of the substrate within the means for processing to loosen the at least one defect relative to the substrate; and means for removing the at least one defect relative to the substrate.

27. The system of claim 26, further comprising means for locating a position of the at least one defect relative to the substrate.

28. The system of claim 27, further including means for directing a focused beam of an ionized gas at the surface of the substrate based on the location of the at least one defect.

29. The system of claim 26, further comprising means for applying an ionized gas at the surface of the substrate based on the composition of the at least one defect.

* * * * *